United States Patent
Klimczak et al.

(10) Patent No.: US 11,747,732 B2
(45) Date of Patent: Sep. 5, 2023

(54) DIGITAL MASKING SYSTEM, PATTERN IMAGING APPARATUS AND DIGITAL MASKING METHOD

(71) Applicant: Jabil Inc., St. Petersburg, FL (US)

(72) Inventors: Scott Klimczak, Taichung (TW); Nicholas Diaco, Taichung (TW)

(73) Assignee: Jabil Inc., St. Petersburg, FL (US)

( * ) Notice: Subject to any disclaimer, the term of this patent is extended or adjusted under 35 U.S.C. 154(b) by 323 days.

(21) Appl. No.: 17/012,556

(22) Filed: Sep. 4, 2020

(65) Prior Publication Data

US 2020/0401048 A1 Dec. 24, 2020

Related U.S. Application Data

(62) Division of application No. 15/801,812, filed on Nov. 2, 2017, now abandoned.

(51) Int. Cl.

| | |
|---|---|
| *G03F 7/20* | (2006.01) |
| *G02B 27/10* | (2006.01) |
| *G02B 27/14* | (2006.01) |
| *G03F 7/00* | (2006.01) |

(Continued)

(52) U.S. Cl.
CPC ......... *G03F 7/2051* (2013.01); *G02B 27/106* (2013.01); *G02B 27/1066* (2013.01); *G02B 27/145* (2013.01); *G03F 7/0037* (2013.01); *G03F 7/70058* (2013.01); *G02B 26/0833* (2013.01); *G02B 26/105* (2013.01); *G03F 7/70* (2013.01)

(58) Field of Classification Search
CPC .. G03F 7/2051; G03F 7/0037; G03F 7/70058; G03F 2007/2067; G03F 7/70291; G03F 7/70416; G03F 7/70275; G02B 27/106; G02B 27/1066; G02B 27/145; G02B 26/0833; G02B 26/105; G02B 27/1026; G02B 27/1046; G02B 27/141; G02B 27/149; B29C 64/277; B33Y 30/00; H04N 9/12; H04N 9/3164
See application file for complete search history.

(56) References Cited

U.S. PATENT DOCUMENTS

| | | |
|---|---|---|
| 4,474,422 A | 10/1984 | Kitamura |
| 4,752,352 A | 6/1988 | Feygin |
| 5,354,414 A | 10/1994 | Feygin |

(Continued)

FOREIGN PATENT DOCUMENTS

| | | | | |
|---|---|---|---|---|
| EP | 2423745 A1 * | 2/2012 | ............ | G03B 21/28 |
| WO | 2005091078 A1 | 9/2005 | | |

OTHER PUBLICATIONS

Search Report appended to an Office Action, which was issued to Chinese counterpart application No. 201880067569.6 by the CNIPA dated Mar. 1, 2023, with an English translation thereof.

*Primary Examiner* — Nahida Sultana
(74) *Attorney, Agent, or Firm* — Young Basile Hanlon & MacFarlane, P.C.

(57) ABSTRACT

A digital masking system includes a supporting structure for supporting a material, and a pattern imaging apparatus. The pattern imaging apparatus includes a light source device, multiple imaging devices that convert light from the light source device into a plurality of light beams each representing an image, and a combiner that combines the light beams into a single light beam which is projected toward a material.

9 Claims, 16 Drawing Sheets

(51) Int. Cl.
*G02B 26/10* (2006.01)
*G02B 26/08* (2006.01)

(56) References Cited

U.S. PATENT DOCUMENTS

| | | | |
|---|---|---|---|
| 5,637,175 A | 6/1997 | Feygin et al. | |
| 5,730,817 A | 3/1998 | Feygin et al. | |
| 5,876,550 A | 3/1999 | Feygin et al. | |
| 6,391,245 B1 * | 5/2002 | Smith | B29C 64/129 |
| | | | 430/324 |
| 7,790,093 B2 | 9/2010 | Shkolnik et al. | |
| 8,003,040 B2 | 8/2011 | El-Siblani | |
| 8,126,580 B2 | 2/2012 | El-Siblani et al. | |
| RE43,955 E | 2/2013 | Shkolnik et al. | |
| 8,379,187 B2 * | 2/2013 | Tanitsu | G02B 27/126 |
| | | | 355/71 |
| 9,025,136 B2 | 5/2015 | Chen et al. | |
| 9,278,370 B2 | 3/2016 | MacCormack et al. | |
| 2004/0075196 A1 | 4/2004 | Leyden et al. | |
| 2006/0239588 A1 | 10/2006 | Hull et al. | |
| 2007/0047043 A1 * | 3/2007 | Kapellner | G02B 27/0944 |
| | | | 359/30 |
| 2009/0140172 A1 * | 6/2009 | Kihara | B29C 64/135 |
| | | | 359/240 |
| 2009/0140466 A1 * | 6/2009 | Kuzusako | B33Y 50/00 |
| | | | 425/169 |
| 2009/0142436 A1 * | 6/2009 | Kuzusako | B33Y 30/00 |
| | | | 264/1.36 |
| 2010/0007852 A1 | 1/2010 | Bietry et al. | |
| 2010/0295919 A1 | 11/2010 | Maeda | |
| 2012/0019793 A1 * | 1/2012 | Park | G03F 7/70275 |
| | | | 355/53 |
| 2015/0251351 A1 | 9/2015 | Feygin | |
| 2015/0355553 A1 | 12/2015 | Allanic | |
| 2016/0009062 A1 | 1/2016 | Keenan et al. | |
| 2017/0235151 A1 | 8/2017 | Kim | |
| 2017/0285936 A1 | 10/2017 | Hirshberg et al. | |
| 2018/0141270 A1 | 5/2018 | Steege | |
| 2018/0180979 A1 | 6/2018 | Xu | |
| 2018/0361773 A1 | 12/2018 | Billiet | |
| 2019/0390081 A1 | 12/2019 | Rolland et al. | |
| 2020/0247042 A1 | 8/2020 | Gardiner et al. | |
| 2020/0378067 A1 * | 12/2020 | Brent, Jr. | B33Y 70/10 |

\* cited by examiner

DIGITAL MASKING SYSTEM, PATTERN IMAGING APPARATUS AND DIGITAL MASKING METHOD

CROSS REFERENCE TO RELATED APPLICATION

This application is a divisional application of U.S. patent application Ser. No. 15/801,812 (filed on Nov. 2, 2017), which is incorporated by reference as if fully set forth.

FIELD OF INVENTION

The disclosure relates to masking system and method, and more particularly to a digital masking system and method.

BACKGROUND

Digital masking is a technology which may be used to form patterns on a photo-sensitive material without a physical photomask (i.e., maskless lithographic processing), and is thus applicable to fields like 3D printing.

As shown in FIG. 1, a conventional projector for 3D printing includes a light source and a digital micromirror device (DMD) chip. The DMD chip may convert light provided by the light source into an image by controlling rotation of each micro mirror thereof between two specific angles (usually having a difference of approximately 20 degrees therebetween) which respectively represent on and off states, so as to create an optical image projection onto a photo-curable material placed on a movable printer bed (not shown). By variation of the image projected on the photo-curable material and movement of the printer bed, a printed 3D object may thus be formed.

However, the DMD chip has a maximum optical power input limit, which limits intensity of light outputted by the projector and thus the speed of 3D printing.

SUMMARY

Therefore, the disclosure provides a digital masking system, a pattern imaging apparatus and a digital masking method that can alleviate at least one of the drawbacks of the prior art.

According to one aspect of the disclosure, the digital masking system includes a pattern imaging apparatus. The pattern imaging apparatus includes a supporting structure for supporting at least one layer of a material, a light source device, a group of imaging devices, and a combiner. The light source device is configured to provide a group of light components. The imaging devices are disposed to respectively receive and convert the light components into a group of light beams each representing an image. The combiner is disposed to receive and combine the light beams into a single light beam output that is projected toward said at least one layer of the material supported by the supporting structure.

According to another aspect of the disclosure, the pattern imaging apparatus is proposed for patterning a material, and includes a light source device configured to provide a plurality of light components, a plurality of imaging devices disposed to respectively receive and convert the light components into a plurality of light beams each representing an image, and a combiner disposed to receive and combine the light beams into a single light beam output that is projected toward said at least one layer of the material.

According to the disclosure, the digital masking method includes: providing a plurality of light components; receiving and converting the light components into a plurality of light beams each representing an image; receiving and combining the light beams into a single light beam output; and projecting the single light beam output toward a material.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION OF THE PREFERRED EMBODIMENT(S)

Figure 1:
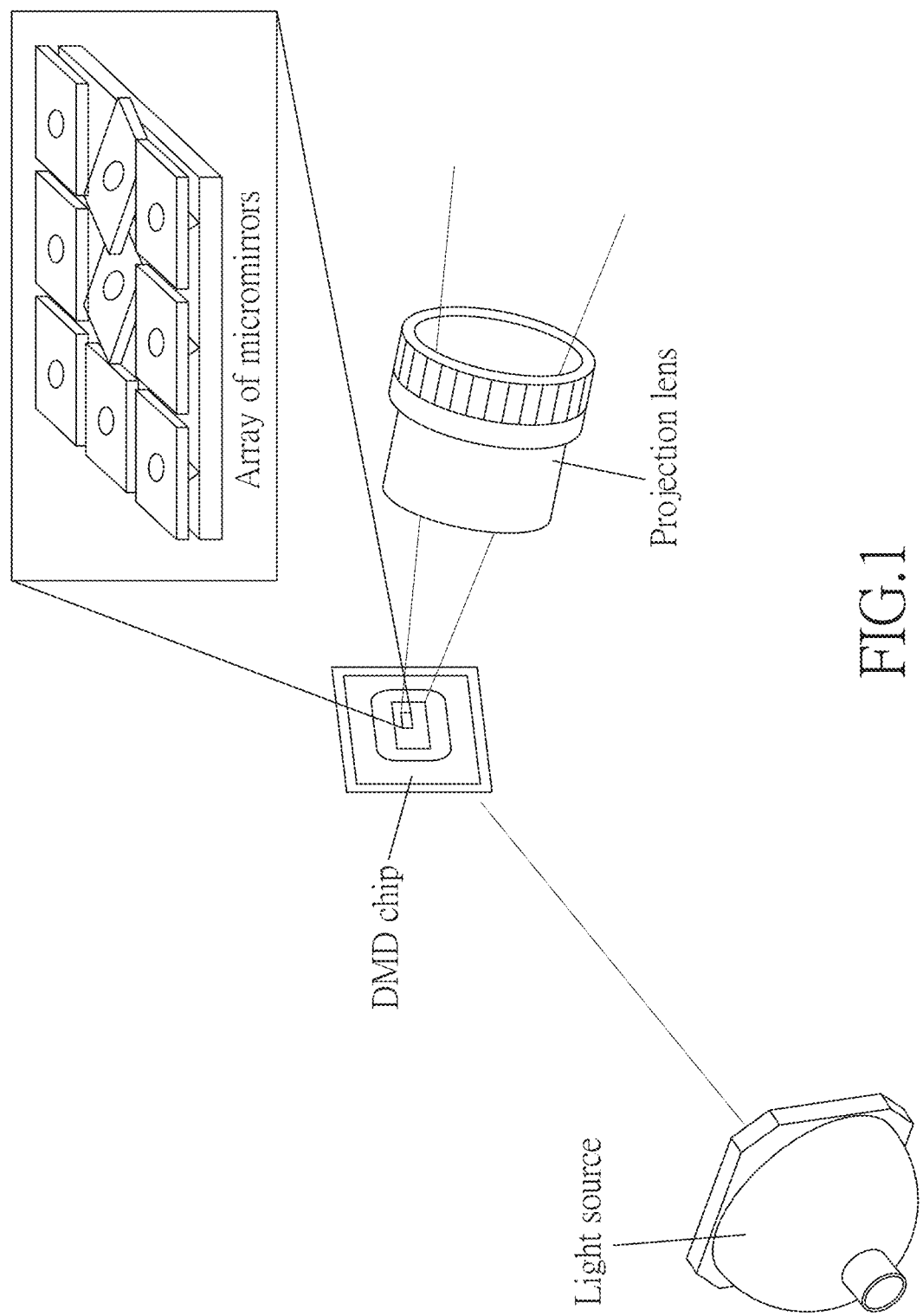
FIG. 1 is a schematic diagram illustrating a conventional projector for 3D printing.

Before the disclosure is described in greater detail, it should be noted that where considered appropriate, reference numerals or terminal portions of reference numerals have been repeated among the figures to indicate corresponding or analogous elements, which may optionally have similar characteristics. It is further noted herein that the term "light," "light beam," "light component," or the like as used throughout this disclosure is not limited to ultra violet (UV) light, and may also mean electromagnetic radiation/wave of any wavelength.

Figure 2:
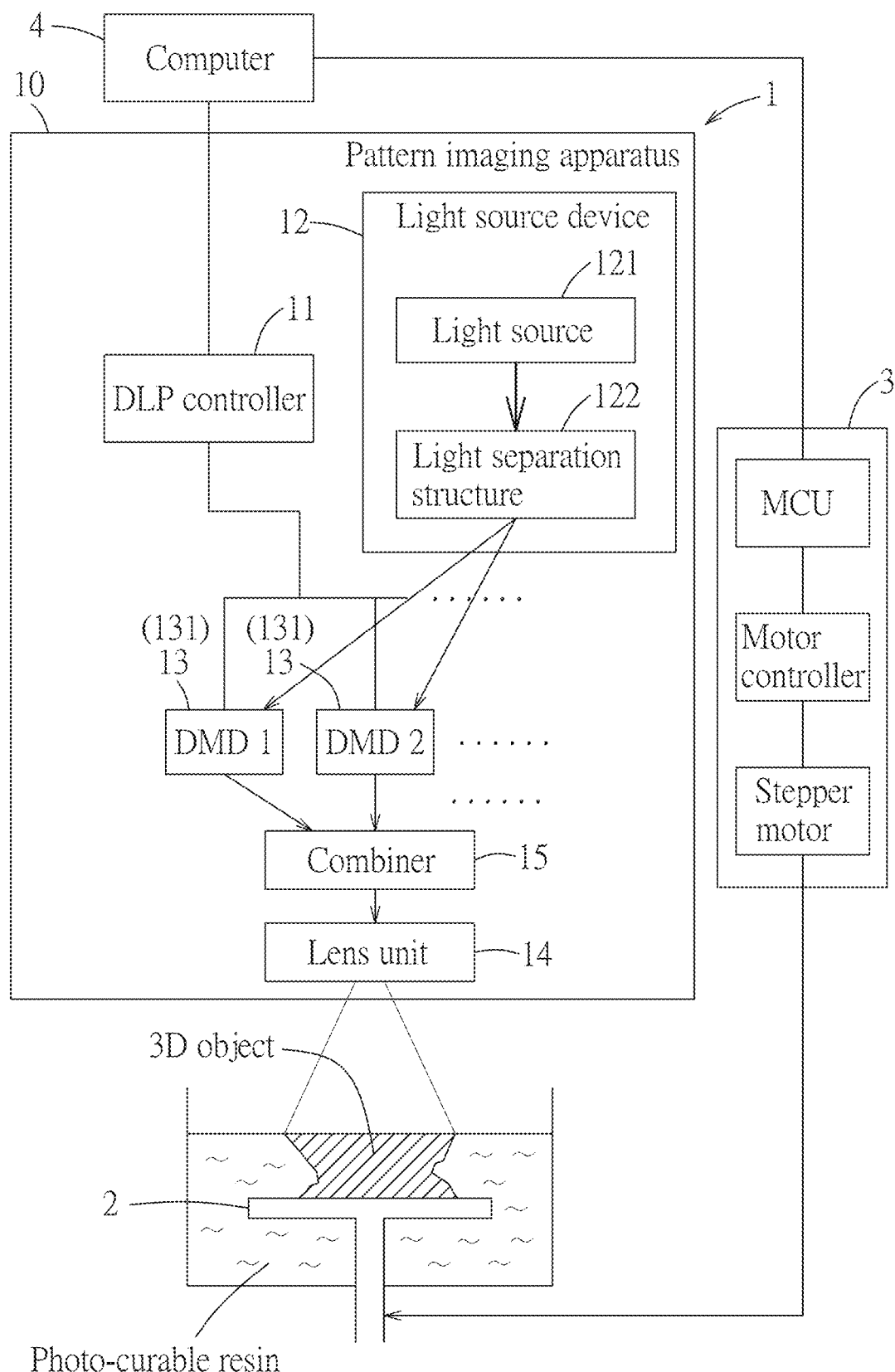
FIG. 2 is a schematic block diagram illustrating a first embodiment of a digital masking system according to this disclosure.

Referring to FIG. 2, a first embodiment of the digital masking system according to this disclosure is exemplarily applied to a 3D printer system. In the embodiment, the digital masking system includes a pattern imaging apparatus 1, a supporting structure 2 on which a printed 3D object is to be supported and formed from a photo-sensitive material, a motor apparatus 3 coupled to the supporting structure 2 for enabling movement thereof, and a computer 4 coupled to the pattern imaging apparatus 1 and the motor apparatus 3 for controlling operations thereof according to printing parameters and printing files inputted by a user. It is noted that the photo-sensitive material used in 3D printing may vary depending on the to-be-used printing technology, and this disclosure is not limited in this respect. For example, the photo-sensitive material may be a solidifiable/photo-curable resin for stereo lithography technology (SLA), digital light processing (DLP), or PolyJet™ technology, sinterable powder of, for example, metal, ceramic, polymer or nylon, for selective laser sintering (SLS) technology, an adhesive like polyvinyl Acetate (PVA) for selective deposition lamination (SDL) technology, or solidifiable powder of, for example, polyamide (PA12), for HP Multi Jet Fusion technology developed by Hewlett-Packard. In an ordinary patterning process, the photo-sensitive material may be a photo-sensitive substrate. In this embodiment, the supporting structure 2 may for instance be immersed in a tank filled with the photo-curable resin in liquid state. In the present disclosure, the pattern image or the resultant pattern image may correspond to a single layer of the printed 3D object when the digital masking system is applied to 3D printing, which is formed while the supporting structure 2 (see FIG. 1) is disposed at a fixed position relative to, e.g., the tank of the photo-sensitive material. With successive patterning operations in cooperation with movement of the supporting structure 2, multiple patterned layers of solidified photo-sensitive material that are stacked together may form the printed 3D object.

The pattern imaging apparatus 1 is configured to generate a patterning light beam that forms a pattern. Examples of suitable techniques to deliver the patterning light beam may include, but are not limited to, spatial light modulators (SLMs), projection units on the basis of digital light processing (DLP®), digital mirror device (DMD®), liquid crystal display (LCD), image light amplifier (ILA®), liquid crystal on silicon (LCoS), silicon X-tal reflective display (SXRD™), etc., light valves, microelectromechanical systems (MEMS), and laser systems, in this embodiment, the pattern imaging apparatus 1 is a projector realized using DLP technology, and includes a DLP controller 11, a light source device 12, a plurality of imaging devices 13 which are digital micromirror device (DMD) chips 131, a lens unit 14, a combiner 15, and a housing 10 (e.g., an outer projector shell that forms an appearance of the projector). The DLP controller 11, the light source device 12, the imaging devices 13, the lens unit 14 and the combiner 15 are mounted on the housing 10, where the expression "mounted on the housing 10" means, but is not limited to, being accommodated within the housing 10 or being indirectly mounted to the housing via, for example, an internal frame (i.e., the components 11-15 may not be directly connected to the housing). The lens unit 14 may include one or more lenses, and/or other components such as mechanical focusing devices, but this disclosure is not limited in this respect.

The DLP controller 11 is configured to control operations of the DMD chips 131 according to instructions from the computer 4.

Figure 3:
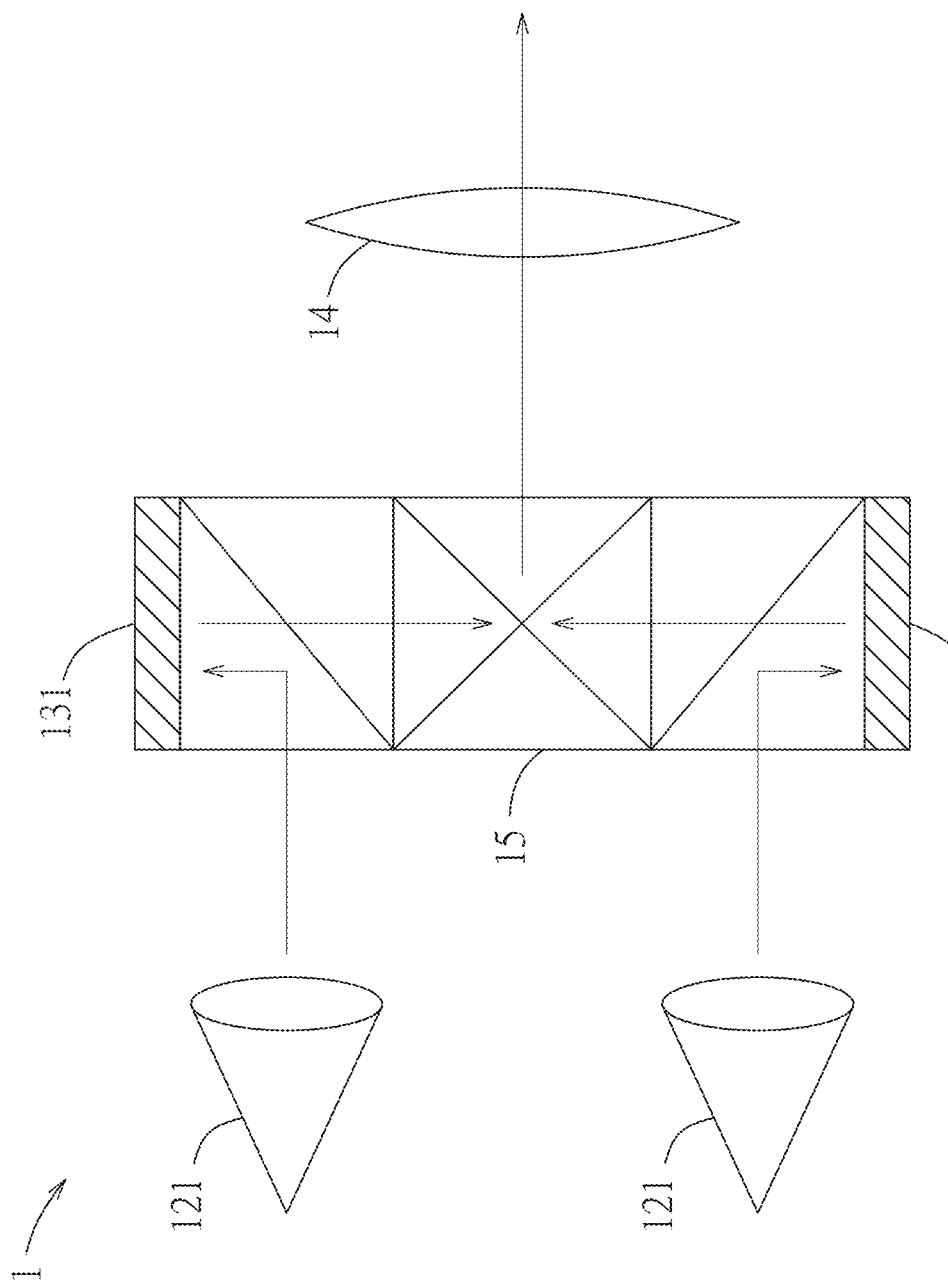
FIG. 3 is a schematic diagram illustrating a pattern imaging apparatus of the first embodiment that utilizes digital light processing technology.

The light source device 12 is configured to provide a plurality of light components respectively to the DMD chips 131. In this embodiment, the light source device 12 includes a single light source 121 to emit light, and a light separation structure 122 (e.g., bifurcating tubes, dichroic filters, etc.) disposed to receive and separate the light emitted by the light source 121 into the light components. In one embodiment, the light source device 12 may include a plurality of light sources each emitting light that serves directly as a respective light component to be provided to a respective one of the DMD chips 131, and the separation structure 122 may be omitted in such case. As exemplified in FIG. 3, the pattern imaging apparatus 1 includes two DMD chips 131 and two light sources 121 for providing the light components respectively to the DMD chips 131. In one embodiment, multiple light sources 121 and the separation structure 122 may be used in a mixed manner to provide the light components, and this disclosure is not limited in this respect. It is noted that the light source device 12 may provide UV light, infrared light, visible light and/or microwave, etc., and this disclosure is not limited thereto. In this embodiment, the light source device 12 provides light components all having one and the same or similar wavelength spectrum to the DMD chips 131.

Each of the DMD chips 131 receives and converts the respective one of the light components into a respective light beam representing an image. The term "image" herein represents a group of pixels respectively corresponding to all of the smallest imaging elements of the imaging device 13 (e.g., the micro mirrors of a DMD chip), so an image represented by a light beam covers a maximum patternable area of the corresponding DMD chip, and includes both of a patterned area (for example, see "pattern" in part (a) of FIG. 4) and a pattern-less area (for example, the "pattern image" excluding the "pattern" in part (a) of FIG. 4). The DMD chips 131 are arranged such that the light beams from the DMD chips 131 are projected toward the photo-curable resin to form the images represented thereby on the photo-curable material through the lens unit 14. Since each of the DMD chips 131 has a maximum power input limit to prevent damage due to overheating, the printing speed would be limited if only one DMD chip 131 is used for patterning. In order to increase the printing speed, the combiner 15 is used in this embodiment to receive and combine multiple light beams, which are converted from the light components having the same or approximately/substantially the same wavelength spectrum, into a single light beam output (i.e., the patterning light beam) with greater intensity while the images represented by the light beams are identical. Combination of multiple light beams into a single light beam refers to redirecting the light beams to have the same or approximately/substantially the same traveling path, so that the images represented thereby are formed on the same or approximately/substantially the same region. After the single light beam output passes through the lens unit 14, the images represented by the light beams completely overlap and are aligned with each other on the photo-curable resin to form a pattern. In this configuration, although power of each of the light components is smaller than or equal to the maximum power input limit, the power of the light components combined may be greater than the maximum power input limit, so as to enhance light intensity of the pattern projected onto the photo-curable resin, leading to greater printing speed, which may exceed the limit otherwise imposed by the maximum power input limit of each DMD chip 131. It is noted that examples of suitable techniques to deliver the light beams include, but are not limited to, spatial light modulators (SLMs), projection units on the basis of Digital Light Processing (DLP®), DMD®, LCD, ILA®, LCOS, SXRD, etc., light valves, MEMs, and laser systems.

Figure 4A:
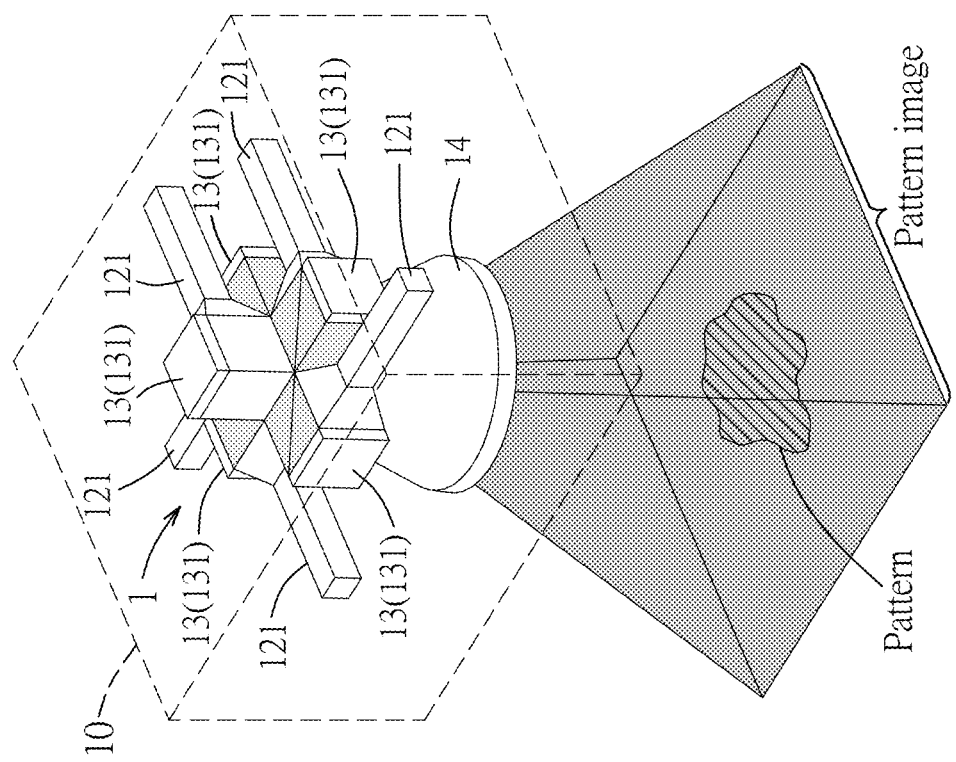
FIGS. 4A and 4B are schematic views illustrating two exemplary implementations of the first embodiment.
Figure 4B:
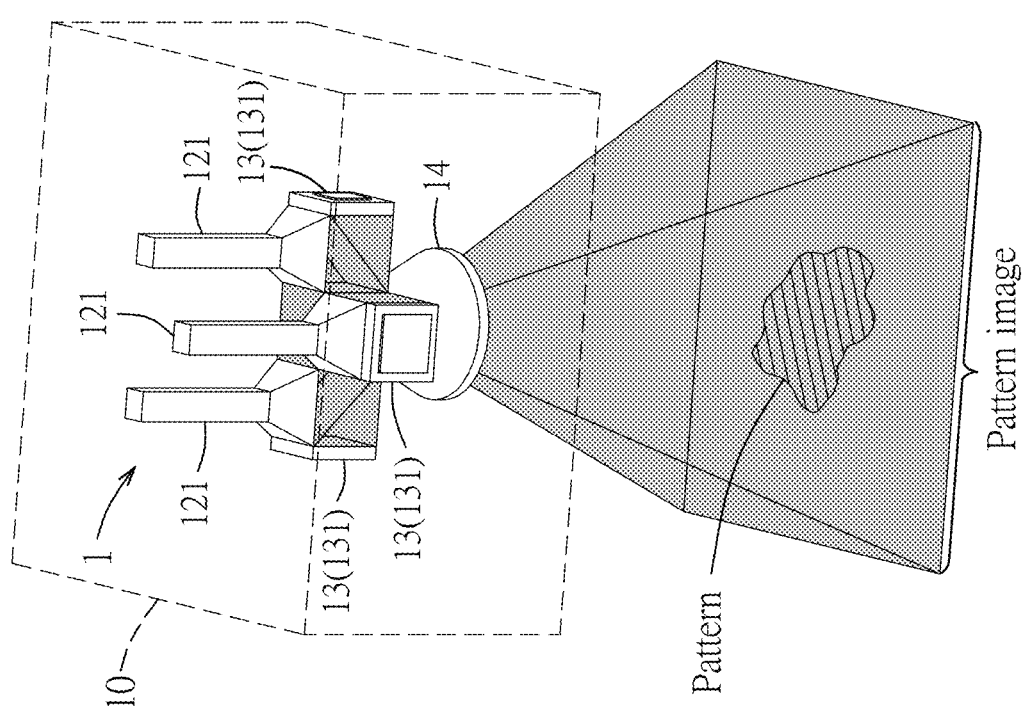

FIGS. 4A and 4B respectively illustrate two exemplary implementations of the first embodiment, in which the pattern imaging apparatus 1 includes three sets of the light source 121 and the imaging device 13 in FIG. 4A, and five sets of the light source 121 and the imaging device 13 in FIG. 4B. In FIGS. 4A and 4B and the following figures and descriptions, the term "pattern image" refers an image which contains a complete pattern (e.g., the island-like portion shown in FIGS. 4A, 4B, 8, 10A, 10B and 11) and which is represented by the light beam output(s) generated by the digital masking system, wherein the digital masking system may include one or more pattern imaging apparatuses 1. The pattern image covers a maximum patternable area of the digital masking system (i.e., an area consisting of the maximum patternable area(s) of all pattern imaging apparatus(es) 1). In this embodiment, since the digital masking system includes only one pattern imaging apparatus 1, and the light beams generated by the imaging devices 13 are combined into a single light beam output, the pattern image is the same or approximately/substantially the same as the image represented by the respective light beam.

Figure 5C:
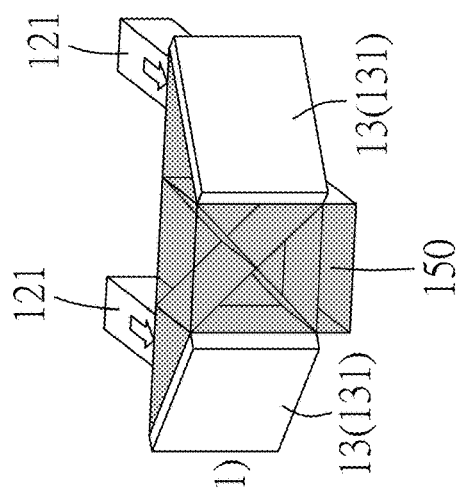
FIGS. 5A, 5B and 5C are schematic views illustrating one exemplary implementation of the first embodiment, where the pattern imaging apparatus is implemented using DLP technology.
Figure 5B:
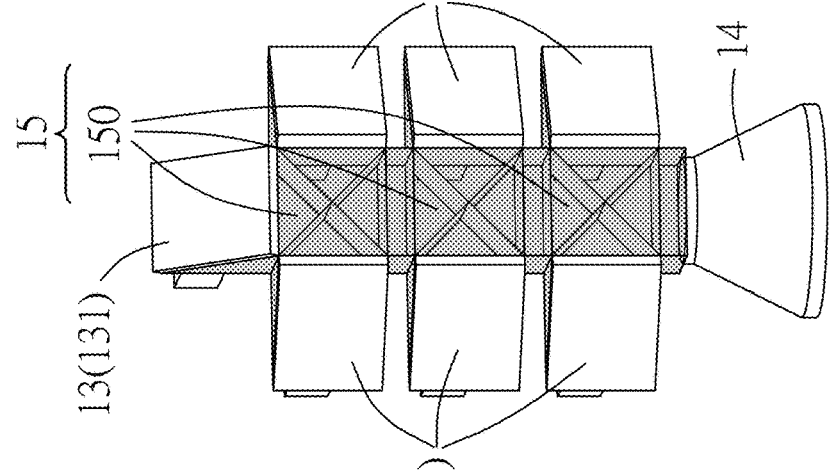
Figure 5A:
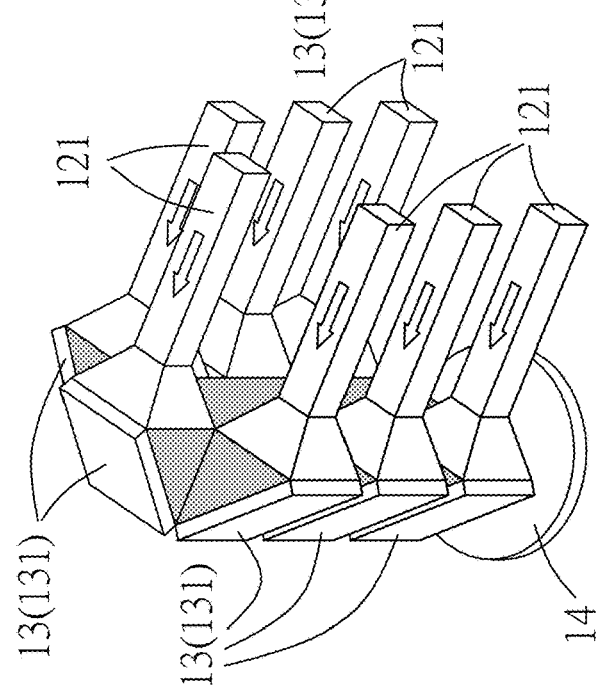
Figure 15:
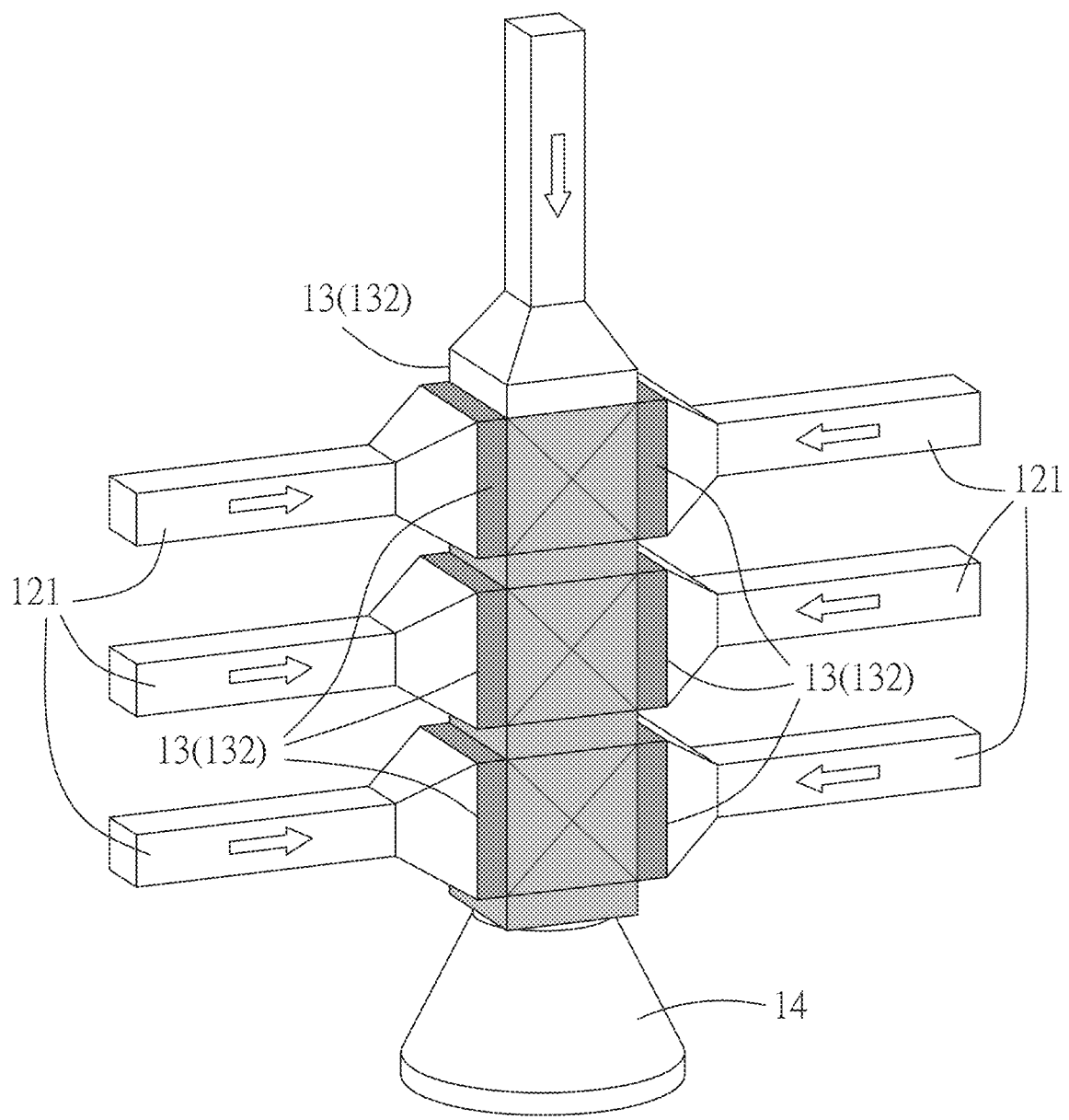
FIG. 15 is a schematic view illustrating one exemplary implementation of the first embodiment, where the pattern imaging apparatus is implemented using LCD technology.
Figure 16B:
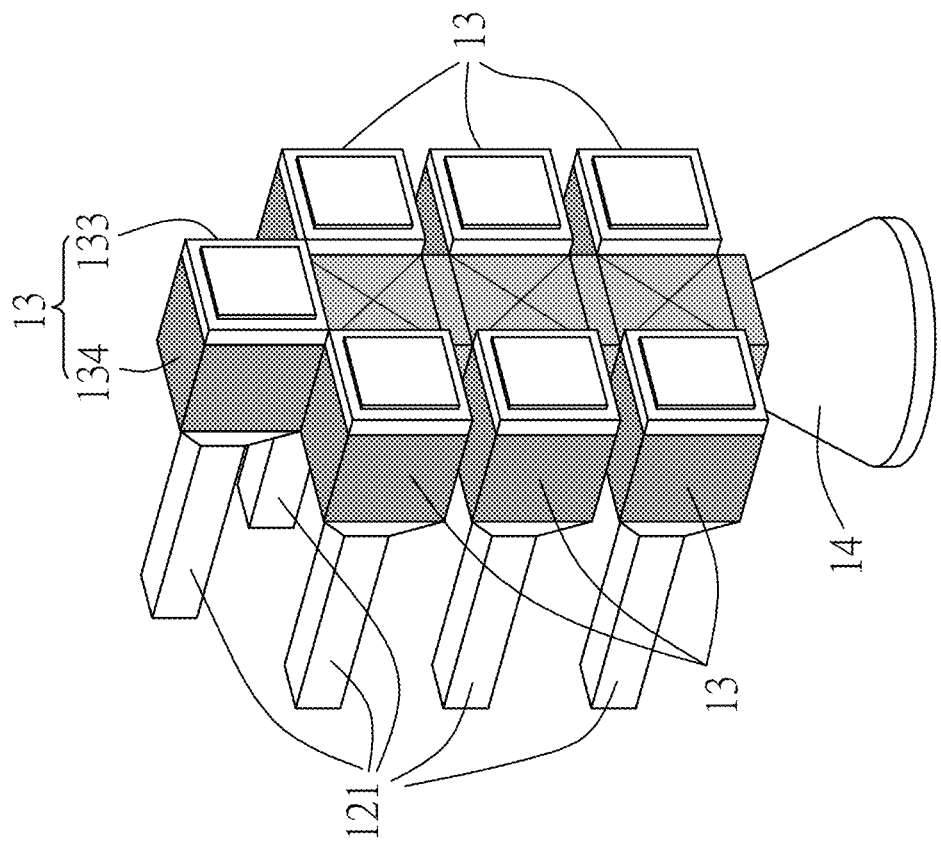
FIGS. 16A and 16B are schematic views illustrating one exemplary implementation of the first embodiment, where the pattern imaging apparatus is implemented using LCoS technology.
Figure 16A:
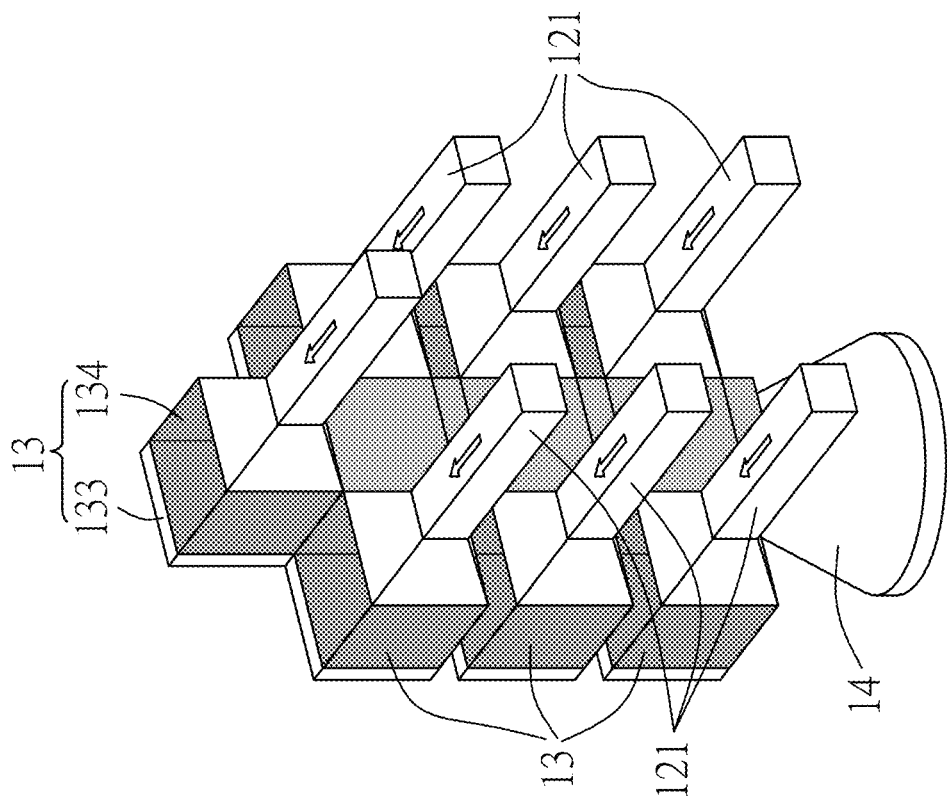

FIGS. 5A, 5B and 5C illustrate another exemplary implementation of the first embodiment, in which the pattern imaging apparatus is exemplified as a projector that includes seven sets of the light source 121 and the imaging device 13. FIGS. 5A and 5B show internal components of the pattern imaging apparatus 1 viewed from different angles. The internal components include three light combination modules that are stacked together one by one. FIG. 5C shows a single light combination module that includes a combiner element 150 (e.g., an optical prism-based component, such as a dichrioc prism, an X-cube, etc.) and at least two imaging devices 13 mounted to the combiner element 150. The combiner element 150 has a pair of connection surfaces (top and bottom surfaces in FIG. 5C opposite to each other, and a plurality mount surfaces (side surfaces in FIG. 5C each of which connects the connection surfaces. Each imaging device 13 can be mounted to one of the mount surfaces for providing the respective light beam into the combiner element 150 therefrom. The connection surface of the combiner element 150 can be used for connection with the connection surface of another combiner element 150, an imaging device 13, or the lens unit 14, etc. As a result, multiple combiner elements 150 can be connected together in series. In FIGS. 5A, 5B and 5C, each combiner element 150 is an optical prism cube mounted with two imaging devices 13 at two opposite mount surfaces thereof. The top one of the light combination modules further includes an additional imaging device 13 mounted to the upper connection surface (while the lower connection surface is mounted with the combiner element 150 of the middle one of the light combination modules). For the bottom one of the light combination modules, the combiner element 150 is mounted with the lens unit 14 on the connection surface thereof for providing the light beam output resulting from the combination of the light beams from the seven imaging devices 13 thereto. Use of the light combination module may enable the pattern imaging apparatus 1 to have any number of sets of the imaging devices 13 and the light sources 121 as desired. For example, the pattern imaging apparatus 1 having an even number of the imaging devices may be realized with one light combination module or multiple light combination modules that are stacked together, where each light combination module has two imaging devices 13 as shown in FIG. 5C; and the pattern imaging apparatus 1 having an odd number of the imaging devices may be realized with one light combination module or multiple light combination modules stacked together, where each light combination module has two imaging devices 13 mounted to the mount surfaces of the corresponding combiner element 150, and a terminal light combination module has an additional imaging device 13 mounted to the connection surface of the corresponding combiner element 150, as shown in FIGS. 5A and 5B. Such structure benefits in terms of cost and package size. It is noted that, in the implementation shown in FIGS. 5A, 5B and 5C, each set of the light source 121 and the imaging device 13 is implemented using DLP technology, in which the light source 121 emits light to the corresponding imaging device 13 (a DMD chip 131) directly, and the imaging device 13 reflects the light into the corresponding combiner element 150 based on the desired pattern. Referring to FIG. 15, another exemplary implementation of the pattern imaging apparatus (a projector) of the first embodiment is shown to be similar to FIGS. 5A, 5B and 5C, and differs in that each set of the light source 121 and the imaging device 13 in FIG. 15 is implemented using LCD technology, in which light provided by the light source 121 passes through the corresponding imaging device 13 (an LCD panel 132) based on the desired pattern, and enters the corresponding combiner element 150. Referring to FIGS. 16A and 16B, yet another exemplary implementation of the pattern imaging apparatus (a projector) of the first embodiment is shown to be similar to FIGS. 5A, 5B and 5C, and differs in that each set of the light source 121 and the imaging device 13 in FIGS. 16A and 16B is implemented using LCoS technology, in which each imaging device 13 may include an optical component (e.g., a polarizing beam splitter 134) and an LCoS chip (including an LCoS panel 133). Light emitted by the light source 121 passes through a polarizing surface of the optical component, reflects off the LCoS panel 133 of the LCoS chip based on the desired pattern, and reflects off a reflective surface of the optical component to enter the corresponding combiner element 150.

It is noted that each implementation exemplified in this disclosure includes the lens unit 14, which may include a focusing lens designed based on a focal distance and focal area required for the specific application, and the combiner 15 for speeding up curing of the photo-sensitive material by combining the light beams from the imaging devices 13 into a single light beam output, but the lens unit 14 and/or the combiner 15 may be omitted from the figures for the sake of clarity.

Figure 6:
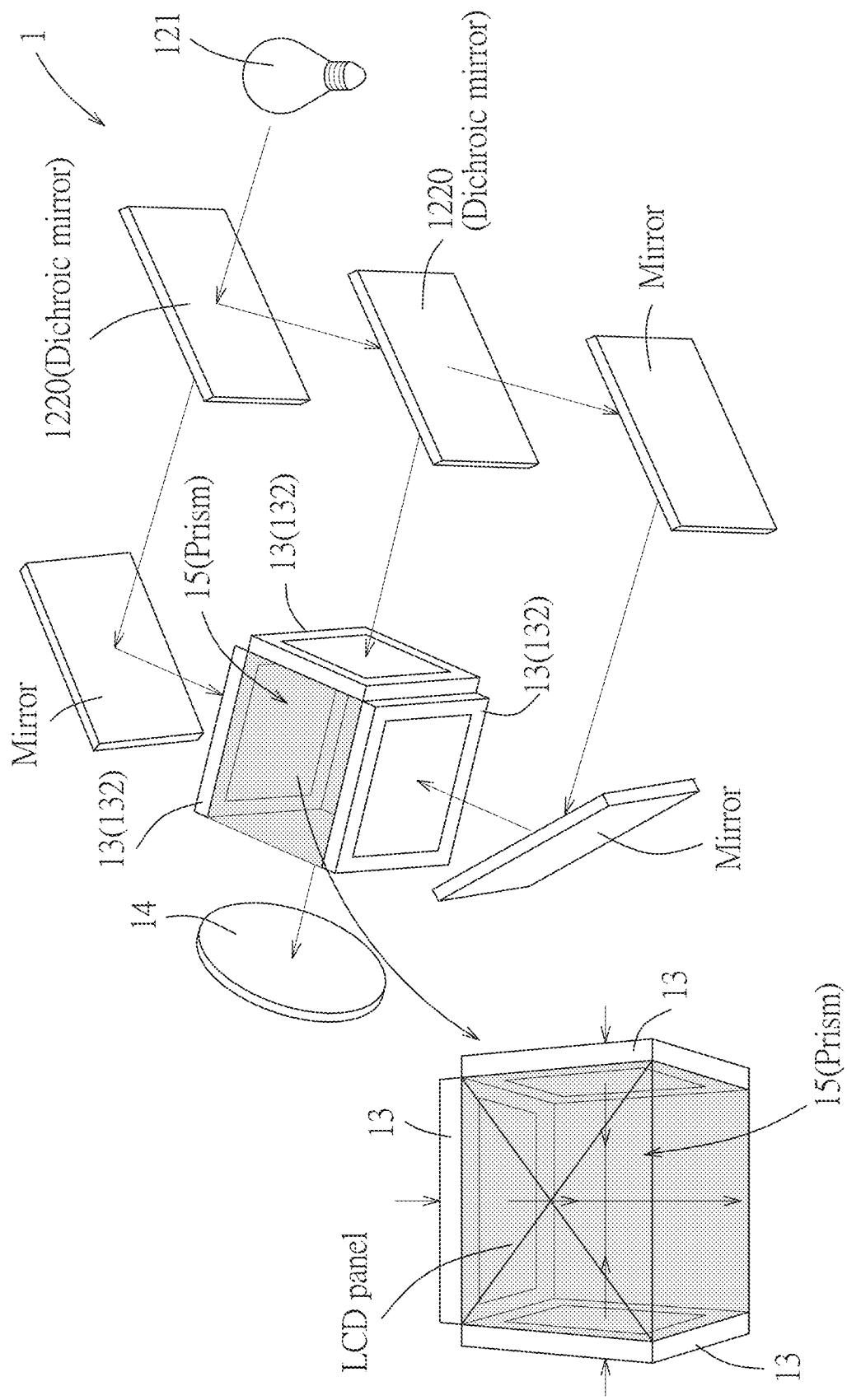
FIG. 6 is a schematic diagram illustrating the pattern imaging apparatus of the first embodiment that utilizes liquid crystal display panel technology.

Referring to FIG. 6, the pattern imaging apparatus 1 according to this disclosure may be realized using liquid crystal display (LCD) technology. In this case, the light source device 12 (see FIG. 1) includes a single light source 121, and the light separation structure 122 includes, for example but not limited to, two dichroic mirrors 1220 to separate light emitted by the light source 121 into three light components respectively for three LCD panels 132 (i.e., the imaging devices 13 in this case). Then, the LCD panels 132 convert the light components into light beams each representing an image, and the light beams are combined together by the combiner 15 (e.g., a prism).

Figure 7:
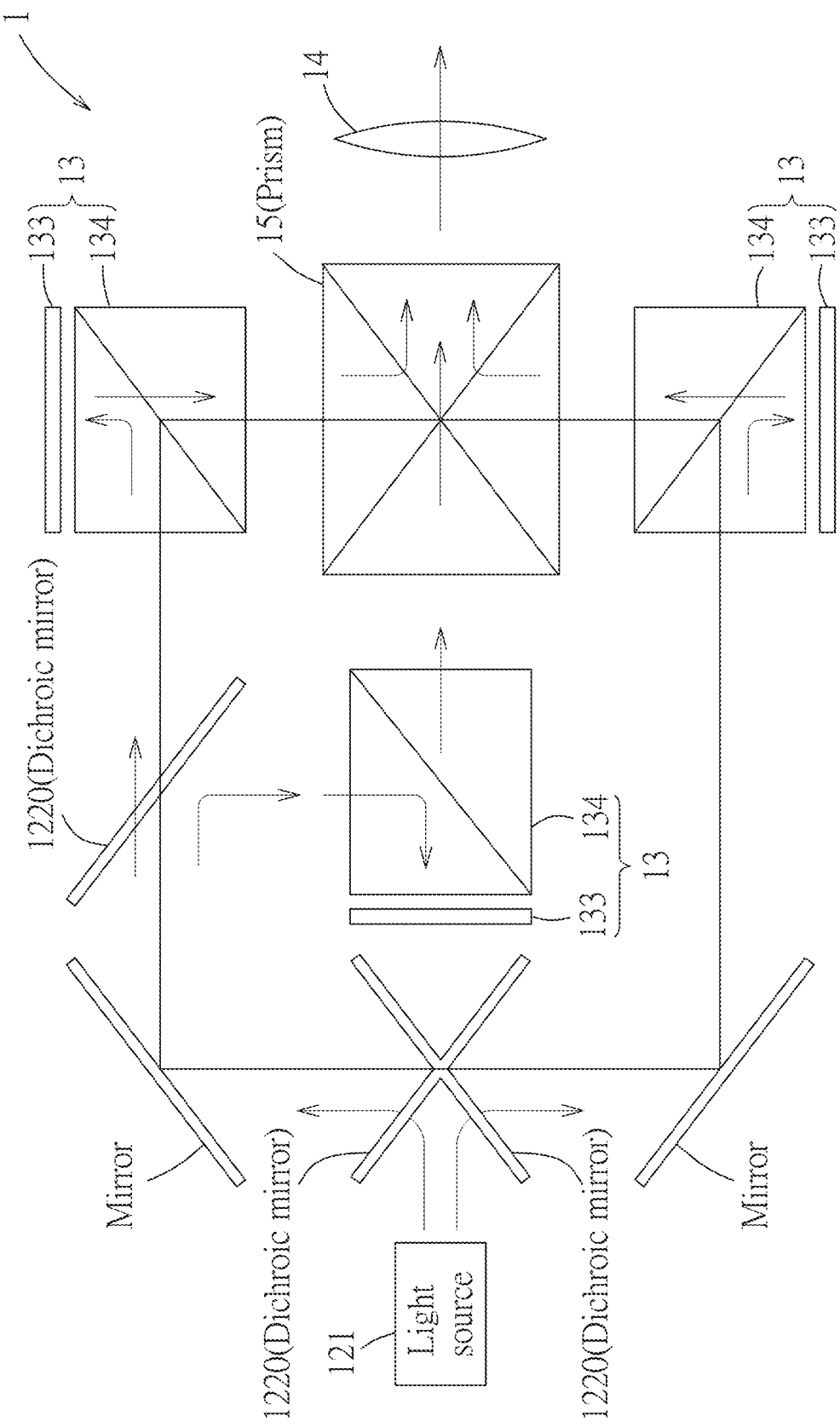
FIG. 7 is a schematic diagram illustrating the pattern imaging apparatus of the first embodiment that utilizes liquid crystal on silicon technology.

Referring to FIG. 7, the pattern imaging apparatus 1 according to this disclosure may be realized using reflecting masking technology, which is exemplified as liquid crystal on silicon (LCoS) technology herein. In this embodiment, the light source device 12 (see FIG. 1) includes a single light source 121, and the light separation structure 122 includes, for example but not limited to, three dichroic mirrors 1220 to separate light emitted by the light source 121 into three light components respectively for three LCoS devices (i.e., the imaging devices 13) each including an LCoS panel 133 and a polarizing beam splitter 134. Then, the LCoS panels 133 convert the light components into light beams each representing an image, and the light beams are combined together by the combiner 15 (e.g., a prism).

Figure 8:
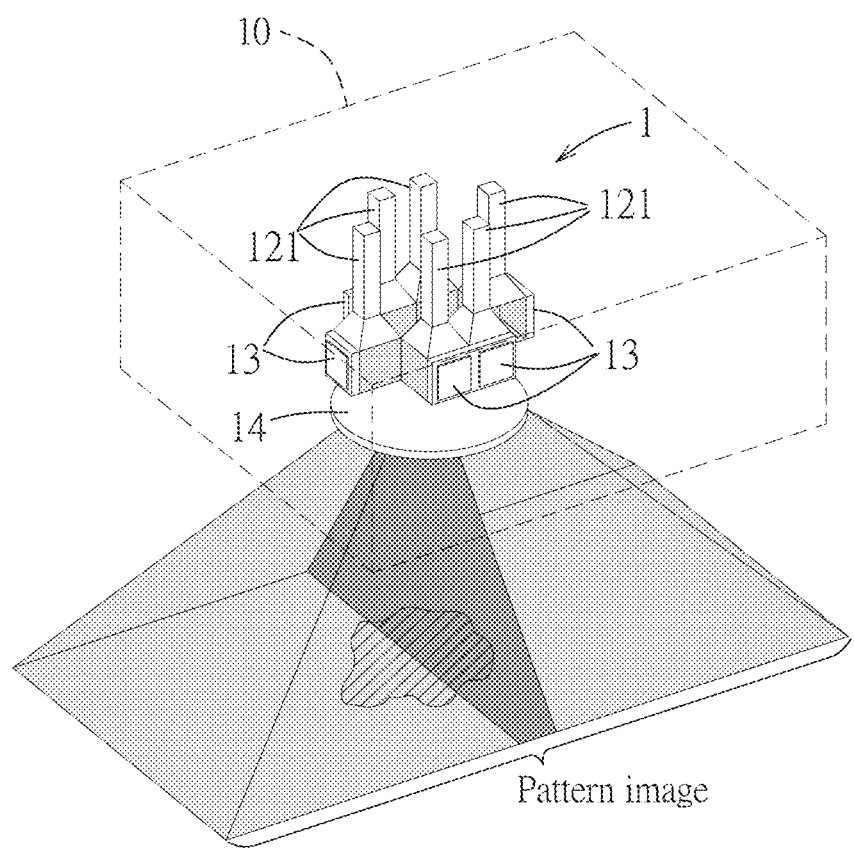
FIG. 8 is a schematic view illustrating a second embodiment of the digital masking system according to this disclosure.

Referring to FIG. 8, a second embodiment of the digital masking system according to this disclosure is shown to include six sets of the imaging devices 13 and the light sources 121 (with one imaging device 13 and one light source 121 composing one set) within a single pattern imaging apparatus 1 to generate two light beam outputs, one of which is provided by three of the six sets in cooperation with a combiner (not shown), and the other one of which is provided by the other three of the six sets in cooperation with another combiner (not shown). Each light beam output represents a respective image portion of a pattern image. The two portions of the pattern image are projected on the photo-sensitive material at adjacent positions, and are non-overlapping or slightly overlapping with each other to constitute the pattern image.

Figure 9:
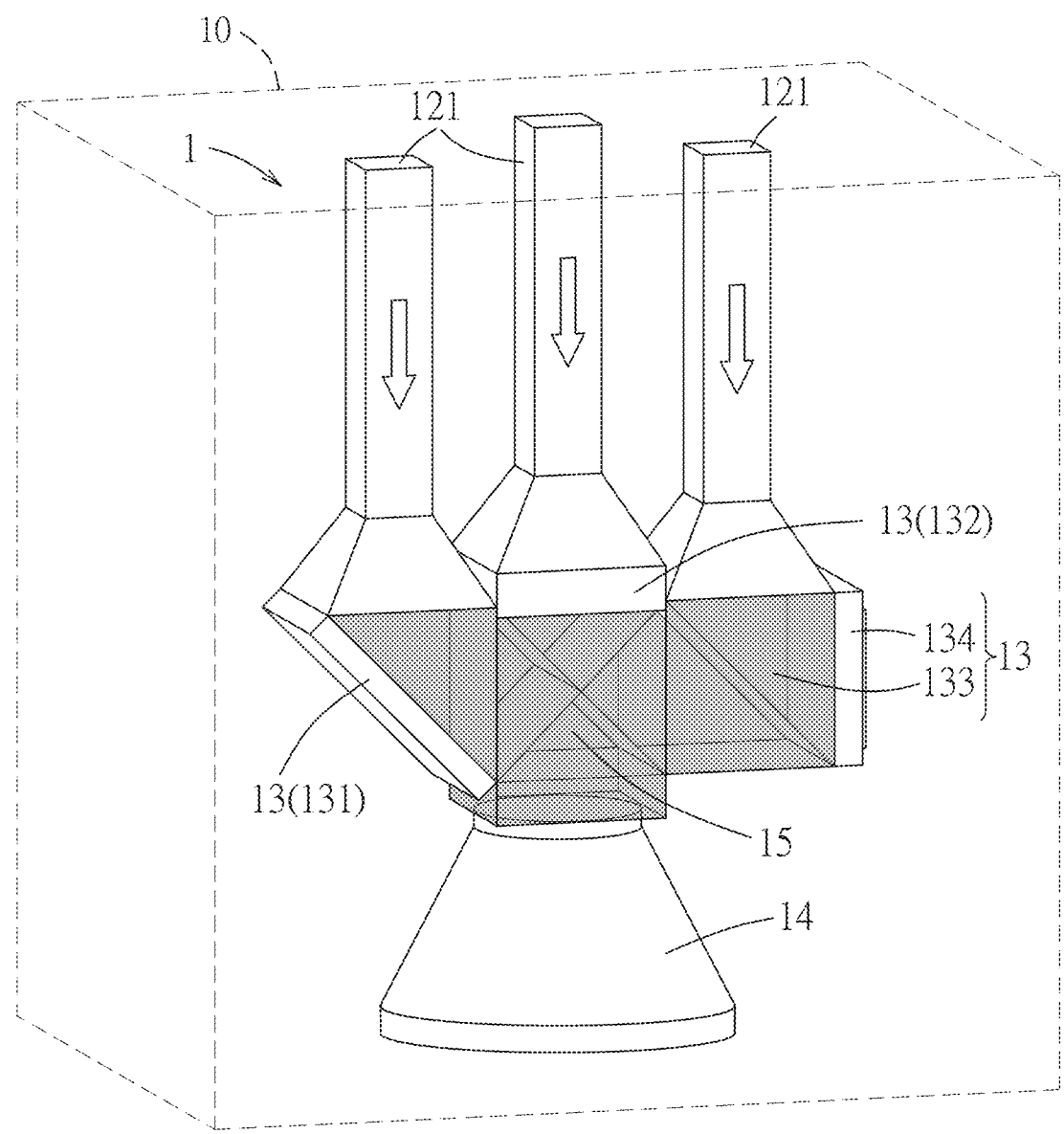
FIG. 9 is a schematic view illustrating a third embodiment of the digital masking system according to this disclosure.

In a third embodiment of the digital masking system according to this disclosure, as shown in FIG. 9, the pattern imaging apparatus 1 may include different types of the imaging devices 13, such as a DMD chip 131, an LCD panel 132 and an LCoS device 133+134 to cooperate with a combiner 15 in one assembly for providing a single light beam output. Such embodiment may provide better process control for different lights, photo-sensitive materials or varying processes.

Figure 10A:
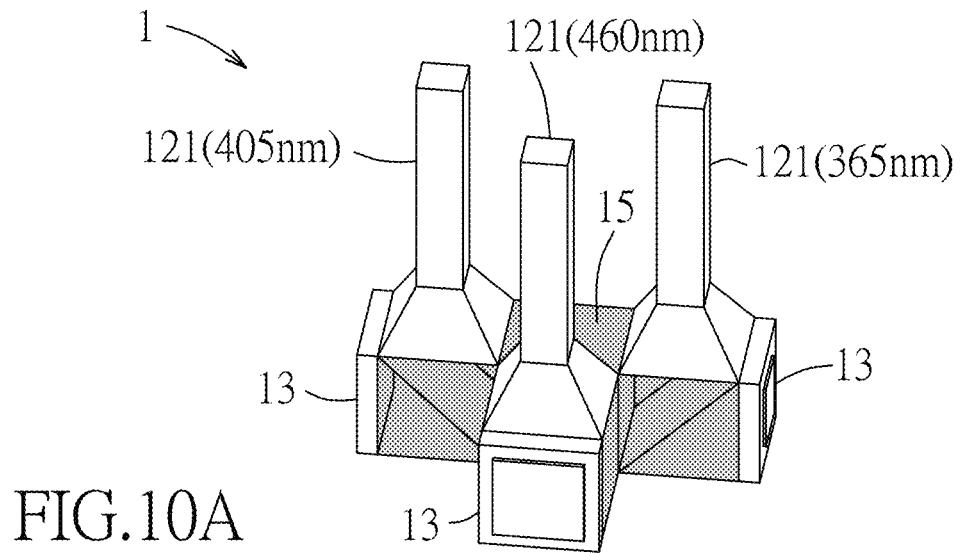
FIGS. 10A and 10B are schematic views illustrating a fourth embodiment of the digital masking system according to this disclosure.
Figure 10B:
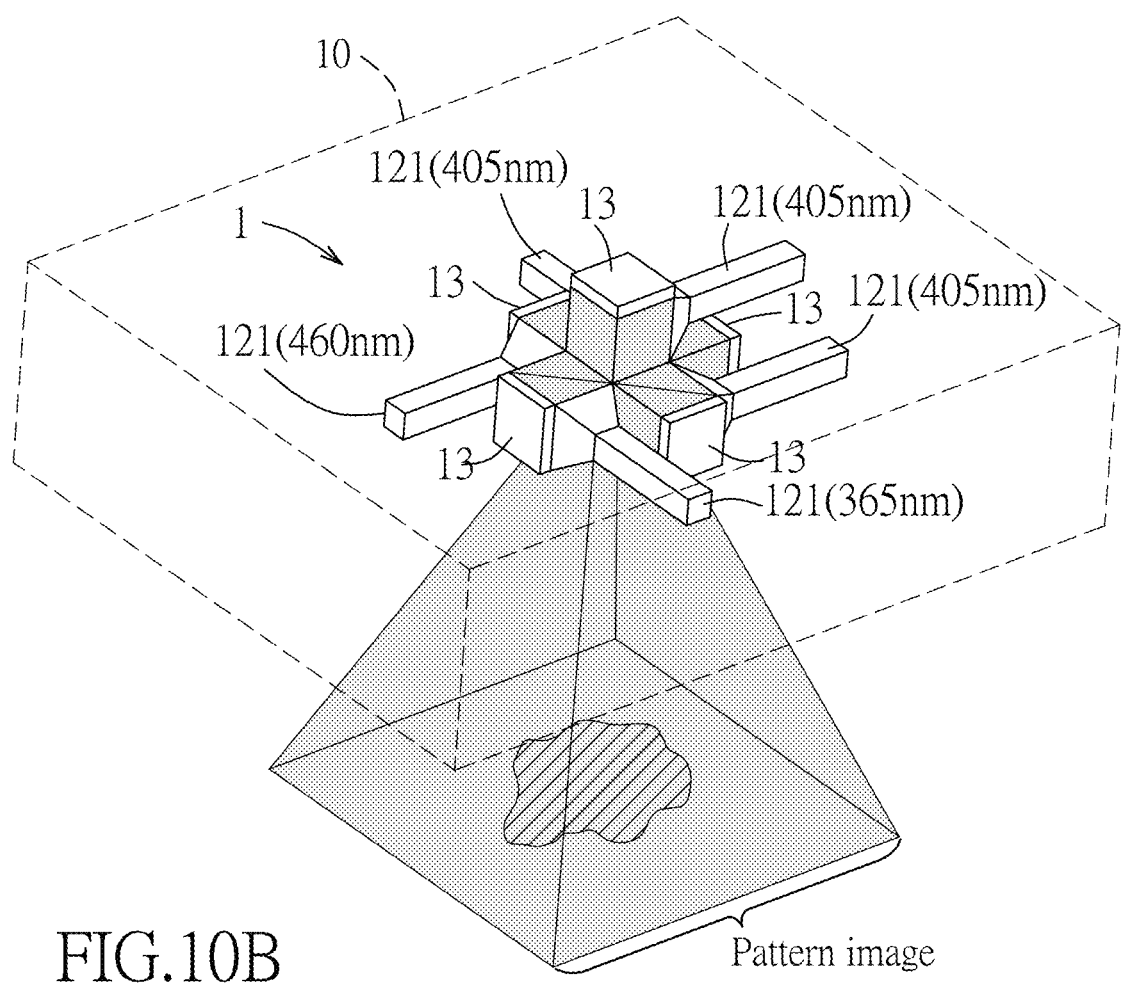

Referring to FIGS. 10A and 10B, a fourth embodiment of the digital masking system according to this disclosure is exemplified to include multiple light sources 121 within the pattern imaging apparatus 1 to provide the light components with multiple wavelength spectrums, wherein the light components with different wavelength spectrums may have different effects on the photo-sensitive material(s). In FIG. 10A, this is simply implemented by providing different light sources 121 for different imaging devices 13. Depending on the design, provision of the light components may be implemented in various manners. For example, the light sources 121 of the light source device 12 (see FIG. 2) may be a combination of a mercury lamp (which emits light with a wide wavelength spectrum, meaning high intensity regions or peaks are widely distributed/dispersed in terms of wavelength) with dichroic filters splitting the light into light components with wavelengths of 365 nm and 405 nm, and a laser light source providing a light component in the infrared range. In a case that more energy is needed for a specific wavelength spectrum, there may be more than one light source 121 that emits light with that f spectrum, as exemplified in FIG. 10B. In FIG. 10B, three light sources 121 are used to emit light with a primary wavelength of 405 nm, and cooperate with two other light sources that emit light with primary wavelengths of 360 nm and 460 nm, the corresponding imaging devices 13, and a combiner (not shown) to generate a single light beam output that forms a pattern image on the photo-sensitive material.

Figure 11:
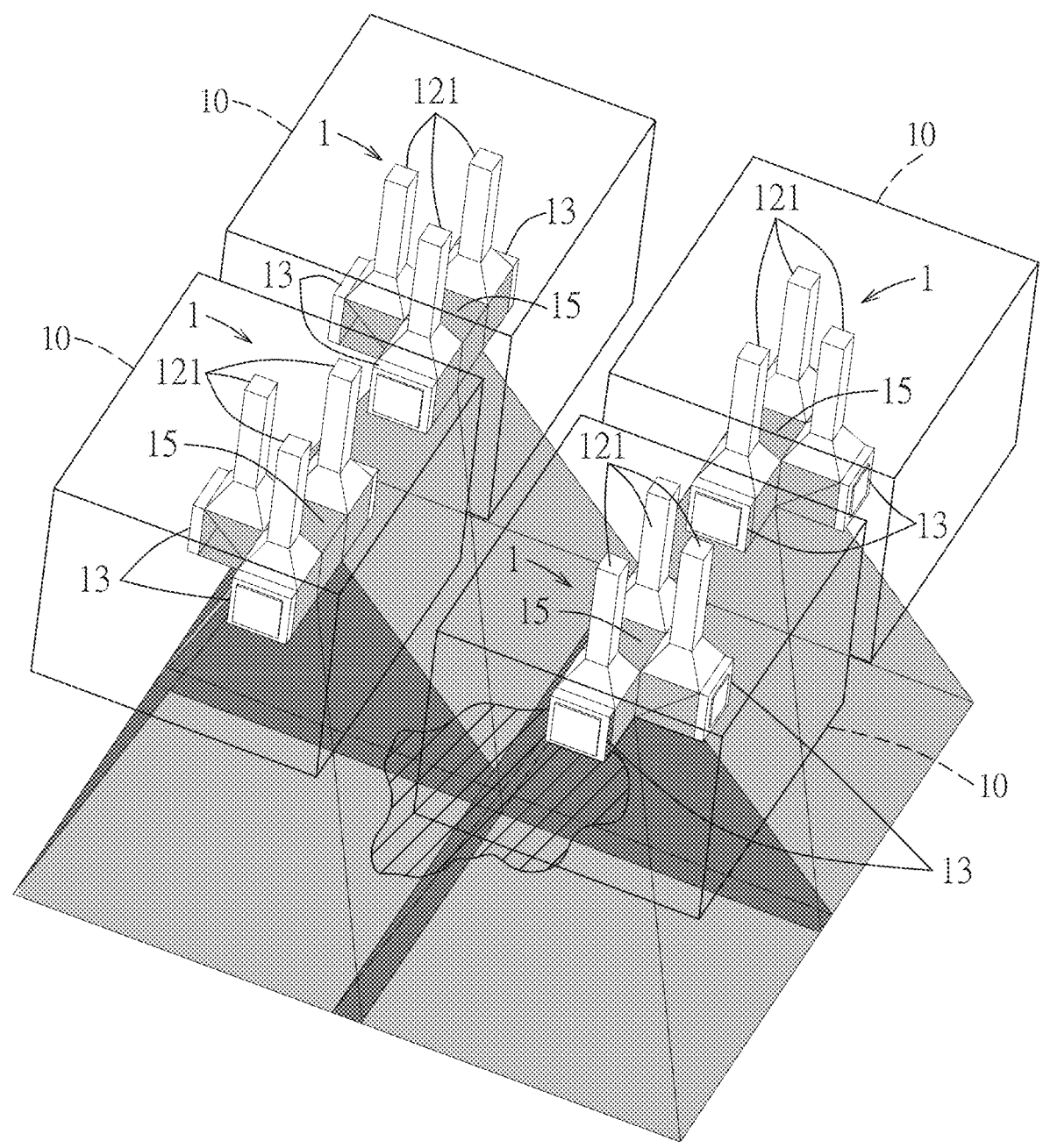
FIG. 11 is a schematic view illustrating a fifth embodiment of the digital masking system according to this disclosure.

FIG. 11 exemplifies a fifth embodiment of the digital masking system which includes four pattern imaging apparatuses 1, each having a housing 10, a combiner 15 mounted to the housing 10, and three sets of the light sources 121 and the imaging devices 13 mounted to and disposed within the housing 10. For each pattern imaging apparatus 1, the three sets of the imaging devices 13 and the light sources 121 cooperate with the corresponding combiner 15 to provide completely overlapping images to serve as one of a total of four portions of the pattern image, and the light sources 121 may emit light with either the same wavelength spectrum to obtain three times the light intensity of a single light source 121, or with different wavelength spectrums based on application requirements.

Figure 12:
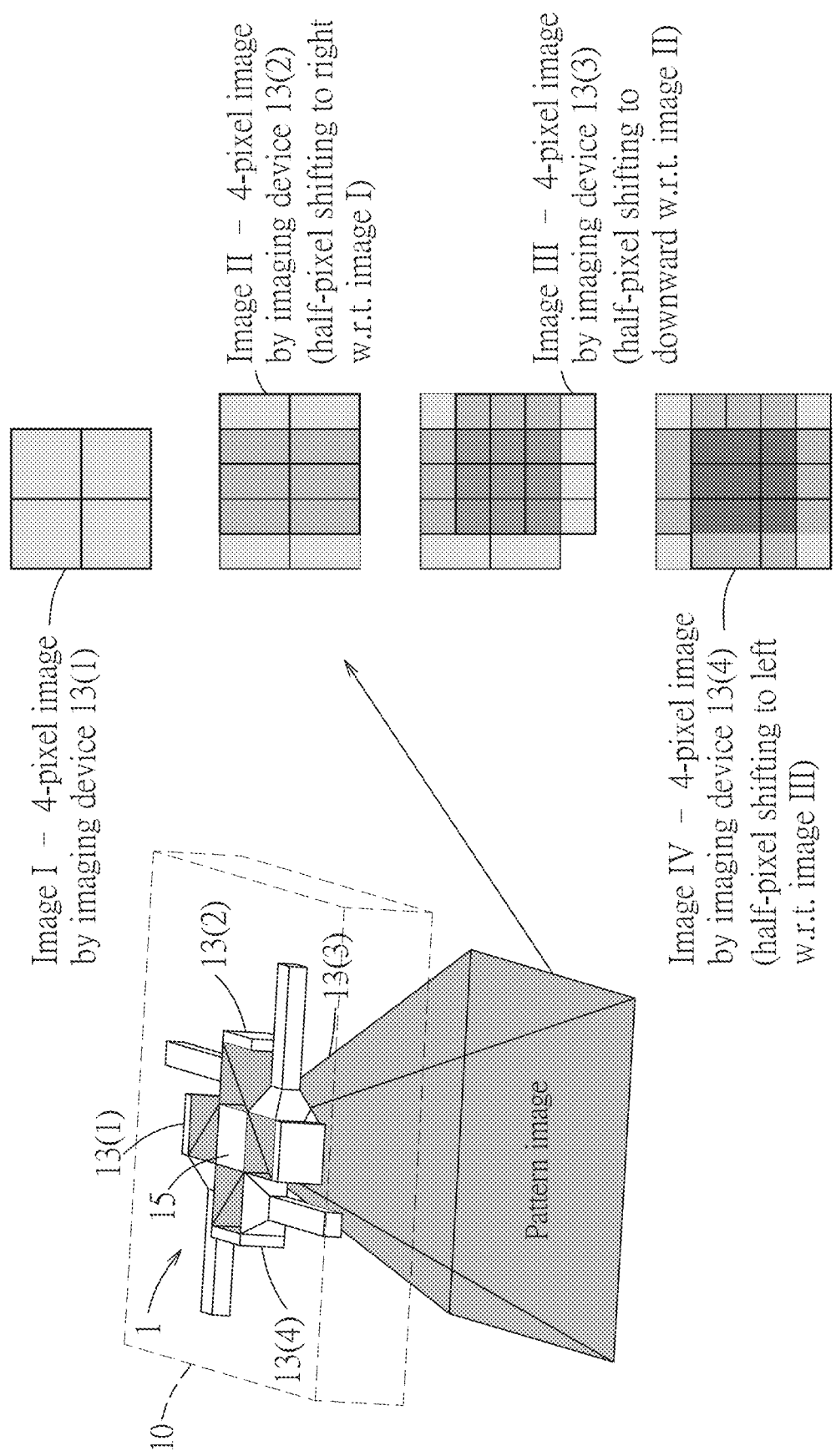
FIG. 12 is a schematic diagram illustrating a sixth embodiment of the digital masking system according to this disclosure.
Figure 13:
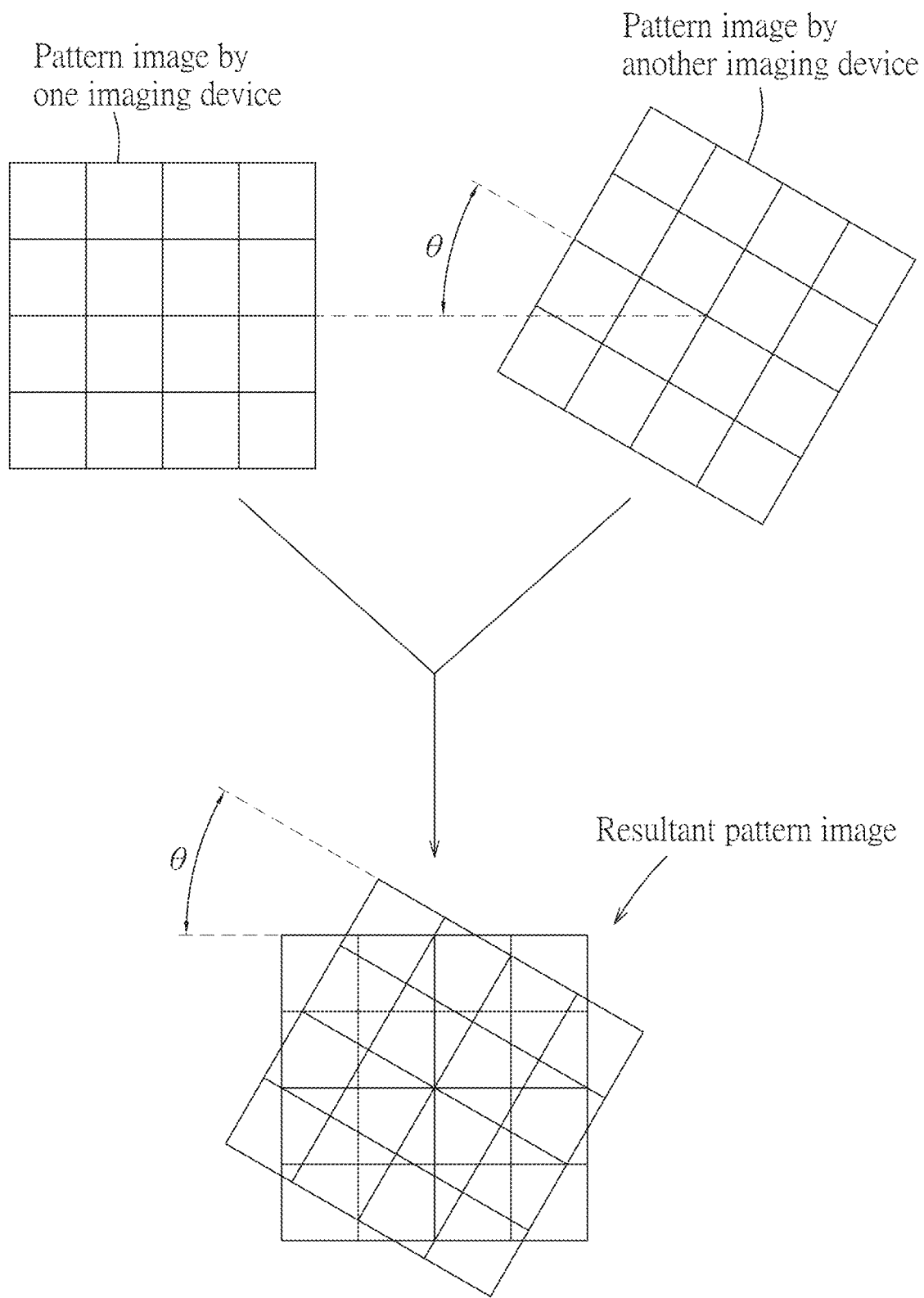
FIG. 13 is a schematic diagram illustrating a seventh embodiment of the digital masking system according to this disclosure.

Referring to FIG. 12, in a sixth embodiment of the digital masking system according to this disclosure, the imaging devices 13 of the pattern imaging apparatus 1 are precisely arranged relative to each other with a specific offset to cause image shifting, such that at least some of the images formed on the photo-sensitive material overlap each other except for edge portions thereof, resulting in higher pixel density of the pattern image. In FIG. 12, the pattern imaging apparatus 1 is exemplified to include four imaging devices 13 each providing the same image with four pixels. The imaging device 13(2) is arranged such that the image provided thereby is ½ pixel (in length or width, which are usually the same) to the right of the image provided by the imaging device 13(1). The imaging device 13(3) is arranged such that the image provided thereby is ½ pixel to the downward of the image provided by the imaging device 13(2). The imaging device 13(4) is arranged such that the image provided thereby is ½ pixel to the left of the image provided by the imaging device 13(3). As a result, a resultant pattern image with higher pixel density (e.g., twenty-five pixels in FIG. 12) is obtained, which may lead to a smoother edge in the X-Y direction. Furthermore, the image shifting may also enhance grayscale control due to pixel blending, which may result in a smoother surface in the Z direction for the final printed 3D object when the digital masking system is applied to 3D printing. It is noted that the imaging devices 13 may be arranged relative to each other in any of the six degrees of freedom in order to obtain the desired image shifting, and this disclosure is not limited to the exemplary implementations described herein. In FIG. 13, the imaging devices 13 are rotated relative to each other for acquiring a smoother edge of the printed 3D object. The concept of the sixth embodiment may be combined with the concept of other embodiments, such as multiple wavelength spectrums of light introduced in the fourth embodiment, to achieve various applications as desired, and details for which will be omitted herein for the sake of brevity.

Figure 14:
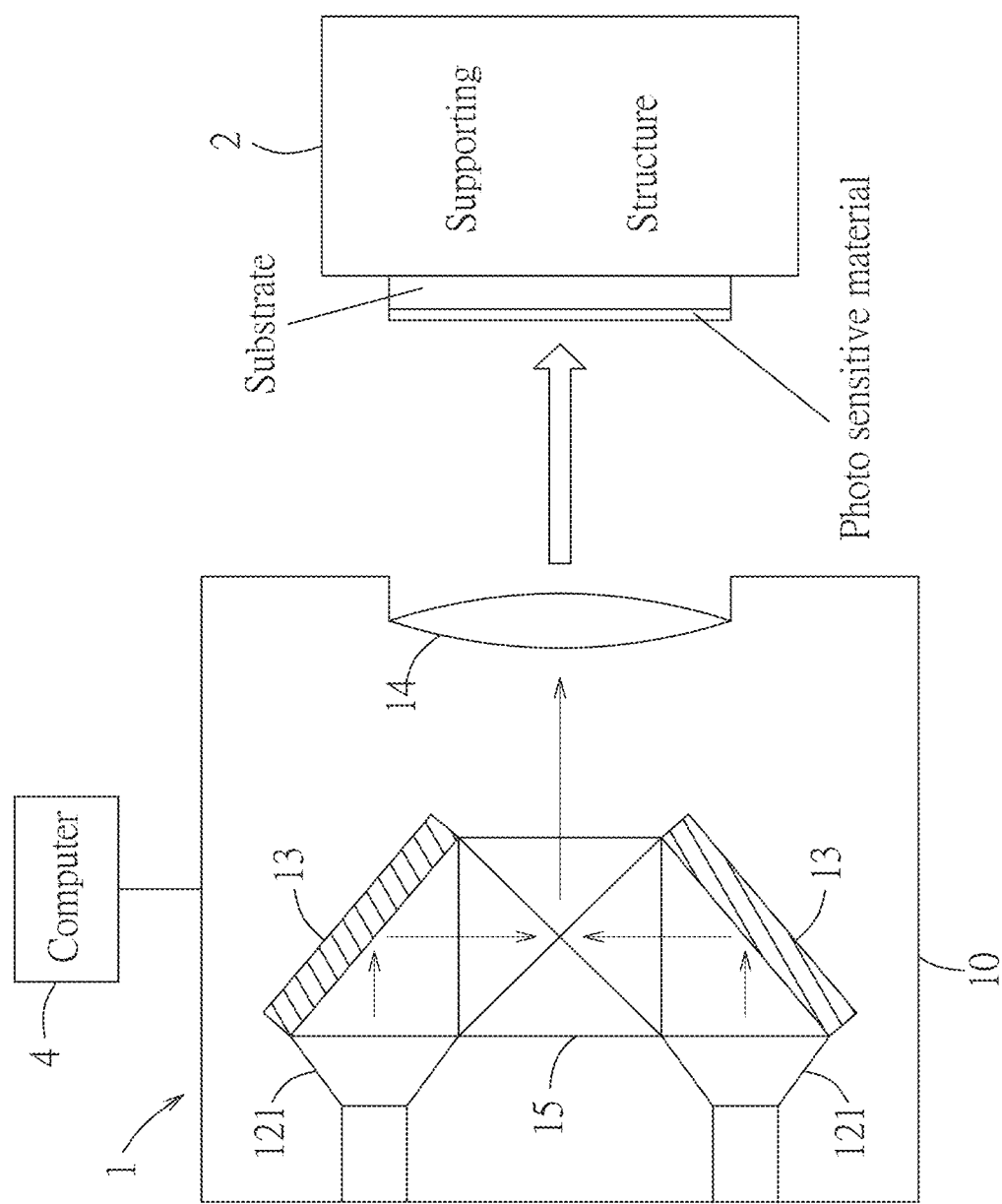
FIG. 14 is a schematic diagram illustrating an eighth embodiment of the digital masking system according to this disclosure.

The pattern imaging apparatus 1 may also be applied to patterning only a single layer of the photo-sensitive material. As exemplified in FIG. 14, the photo-sensitive material may be, for example, a photo resist layer formed on a substrate (e.g., a silicon wafer). The pattern imaging apparatus 1 includes multiple imaging devices 13 cooperating with the combiner 15 and the lens unit 14 to project the single light beam output onto the photo-sensitive material, so as to form a desired pattern thereon. Parts of the photo-sensitive material that are irradiated by the pattern area of the image represented by the light beam output may be solidified, and the other parts of the photo-sensitive material that correspond to pattern-less area of the image represented by the light beam output (e.g., the parts that are not irradiated) remain in the original state, thereby completing maskless exposure. After the subsequent development and etching process, the substrate is formed with the desired pattern.

In summary, the digital masking system according to this disclosure includes multiple imaging devices 13 configured therein to achieve higher light intensity, higher resolution, and/or higher pixel density of the (resultant) pattern image. Since the multiple imaging devices 13 are robustly configured within the housing 10 of the digital masking system 1 during the manufacturing process, high assembly precision of the devices (e.g., imaging devices 13, light source device 12, etc.) may be achieved (e.g., with a nanoscale tolerance), leading to high precision in image positioning (e.g., image overlapping, image shifting, etc.). In addition, since the imaging devices 13 are small in size and are close to each other within the digital masking system 1, distortion among the images provided by different imaging devices may be minimized.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A digital masking method, comprising:
   providing a plurality of light components;
   receiving and converting the plurality of light components into a plurality of light beams each representing an image, wherein the step of receiving and converting is performed by a plurality of digital micromirror devices, and each of the plurality of digital micromirror devices has a maximum power input limit;
   receiving and combining the plurality of light beams into a single light beam output; and
   projecting the single light beam output toward a material;
   wherein power of each of the plurality of light components is smaller than or equal to the maximum power input limit, and a sum of the power of the plurality of light components is greater than the maximum power input limit.

2. The digital masking method of claim 1, wherein the plurality of light components have substantially the same wavelength spectrum.

3. The digital masking method of claim 1, wherein at least two of the plurality of light components have substantially different wavelength spectrums.

4. The digital masking method of claim 1, wherein the images represented by the plurality of light beams are identical, and the images represented by the plurality of light beams that are combined into the single light beam output completely overlap each other on the material.

5. The digital masking method of claim 1, wherein at least some of the images represented by some of the plurality of light beams overlap each other except for edge portions thereof on the material.

6. The digital masking method of claim 1, wherein the plurality of light components have substantially the same wavelength spectrum.

7. The digital masking method of claim 1, wherein at least two of the plurality of light components have substantially different wavelength spectrums.

8. The digital masking method of claim 1, wherein one of the images represented by the plurality of light beams is linearly shifted by ½ pixels from another one of the images represented by the plurality of light beams when the images represented by the plurality of light beams are formed on the material.

9. The digital masking method of claim 1, wherein one of the images represented by the plurality of light beams is angularly shifted relative to another one of the images represented by the plurality of light beams when the images represented by the plurality of light beams are formed on the material.

* * * * *